United States Patent
Forbes

(10) Patent No.: US 7,480,186 B2
(45) Date of Patent: Jan. 20, 2009

(54) NROM FLASH MEMORY WITH SELF-ALIGNED STRUCTURAL CHARGE SEPARATION

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 11/652,219

(22) Filed: Jan. 11, 2007

(65) Prior Publication Data

US 2007/0109871 A1    May 17, 2007

Related U.S. Application Data

(63) Continuation of application No. 10/701,139, filed on Nov. 4, 2003, now Pat. No. 7,184,315.

(51) Int. Cl.
*G11C 16/04*    (2006.01)

(52) U.S. Cl. .................. 365/185.28; 365/185.27; 365/185.11

(58) Field of Classification Search ............ 365/185.28, 365/185.27, 185.11
See application file for complete search history.

(56) References Cited

U.S. PATENT DOCUMENTS

| | | |
|---|---|---|
| 4,184,207 A | 1/1980 | McElroy |
| 4,420,504 A | 12/1983 | Cooper |
| 4,485,390 A | 11/1984 | Jones et al. |
| 4,755,864 A | 7/1988 | Ariizumi |
| 4,881,114 A | 11/1989 | Mohsen |
| 5,005,072 A | 4/1991 | Gonzalez |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |
| 5,397,725 A | 3/1995 | Wolstenholme |
| 5,467,305 A | 11/1995 | Bertin |
| 5,576,236 A | 11/1996 | Chang |
| 5,768,192 A | 6/1998 | Eitan |
| 5,792,697 A | 8/1998 | Wen |

(Continued)

FOREIGN PATENT DOCUMENTS

EP    84303740.9    1/1985

(Continued)

OTHER PUBLICATIONS

B. Eitan et al., "Characterization of Channel Hot Electron Injection by the Subthreshold Slope of NROM™ Device," IEEE Electron Device Lett., vol. 22, No. 11, (Nov. 2001) pp. 556-558, Copyright 2001 IEEE.

(Continued)

*Primary Examiner*—Thong Q Le
(74) *Attorney, Agent, or Firm*—Leffert Jay & Polglaze, P.A.

(57) ABSTRACT

A nitride read only memory (NROM) cell has a nitride layer that is not located under the center of the transistor. The gate insulator layer, with the nitride layer, is comprised of two sections that each have structurally defined and separated charge trapping regions. A charge is stored on a particular trapping region in response to the direction that the transistor is operated. The two sections of the gate insulator separate outer regions of the polysilicon gate structure from the middle region.

25 Claims, 6 Drawing Sheets

U.S. PATENT DOCUMENTS

| | | |
|---|---|---|
| 5,858,841 A | 1/1999 | Hsu |
| 5,911,106 A | 6/1999 | Tasaka |
| 5,946,558 A | 8/1999 | Hsu |
| 5,960,285 A | 9/1999 | Hong |
| 5,966,603 A | 10/1999 | Eitan |
| 5,994,745 A | 11/1999 | Hong |
| 6,011,725 A | 1/2000 | Eitan |
| 6,028,342 A | 2/2000 | Chang |
| 6,030,871 A | 2/2000 | Eitan |
| 6,044,022 A | 3/2000 | Nachumovsky |
| 6,081,456 A | 6/2000 | Dadashev |
| 6,087,220 A | 7/2000 | Rogers et al. |
| 6,108,240 A | 8/2000 | Lavi |
| 6,133,102 A | 10/2000 | Wu |
| 6,134,156 A | 10/2000 | Eitan |
| 6,147,904 A | 11/2000 | Liron |
| 6,157,570 A | 12/2000 | Nachumovsky |
| 6,172,396 B1 | 1/2001 | Chang |
| 6,174,758 B1 | 1/2001 | Nachumovsky |
| 6,175,523 B1 | 1/2001 | Yang |
| 6,181,597 B1 | 1/2001 | Nachumovsky |
| 6,184,089 B1 | 2/2001 | Chang |
| 6,201,282 B1 | 3/2001 | Eitan |
| 6,201,737 B1 | 3/2001 | Hollmer |
| 6,204,529 B1 | 3/2001 | Lung |
| 6,207,504 B1 | 3/2001 | Hsieh |
| 6,208,557 B1 | 3/2001 | Bergemont |
| 6,215,702 B1 | 4/2001 | Derhacobian |
| 6,218,695 B1 | 4/2001 | Nachumovsky |
| 6,222,768 B1 | 4/2001 | Hollmer |
| 6,240,020 B1 | 5/2001 | Yang |
| 6,243,300 B1 | 6/2001 | Sunkavalli |
| 6,251,731 B1 | 6/2001 | Wu |
| 6,255,166 B1 | 7/2001 | Ogura |
| 6,256,231 B1 | 7/2001 | Lavi |
| 6,266,281 B1 | 7/2001 | Derhacobian |
| 6,269,023 B1 | 7/2001 | Derhacobian |
| 6,272,043 B1 | 8/2001 | Hollmer |
| 6,275,414 B1 | 8/2001 | Randolph |
| 6,282,118 B1 | 8/2001 | Lung |
| 6,291,854 B1 | 9/2001 | Peng |
| 6,297,096 B1 | 10/2001 | Boaz |
| 6,303,436 B1 | 10/2001 | Sung |
| 6,327,174 B1 | 12/2001 | Jung |
| 6,335,554 B1 | 1/2002 | Yoshikawa |
| 6,348,711 B1 | 2/2002 | Eitan |
| 6,388,293 B1 | 5/2002 | Ogura |
| 6,392,930 B2 | 5/2002 | Jung |
| 6,417,053 B1 | 7/2002 | Kuo |
| 6,421,275 B1 | 7/2002 | Chen |
| 6,429,063 B1 | 8/2002 | Eitan |
| 6,432,778 B1 | 8/2002 | Lai |
| 6,461,949 B1 | 10/2002 | Chang |
| 6,468,864 B1 | 10/2002 | Sung |
| 6,469,342 B1 | 10/2002 | Kuo |
| 6,477,084 B1 | 11/2002 | Eitan |
| 6,486,028 B1 | 11/2002 | Chang |
| 6,487,050 B1 | 11/2002 | Liu |
| 6,498,377 B1 | 12/2002 | Lin |
| 6,514,831 B1 | 2/2003 | Liu |
| 6,531,887 B2 | 3/2003 | Sun |
| 6,545,309 B1 | 4/2003 | Kuo |
| 6,552,387 B1 | 4/2003 | Eitan |
| 6,559,013 B1 | 5/2003 | Pan |
| 6,576,511 B2 | 6/2003 | Pan |
| 6,580,135 B2 | 6/2003 | Chen |
| 6,580,630 B1 | 6/2003 | Liu |
| 6,599,801 B1 * | 7/2003 | Chang et al. ............ 438/257 |
| 6,602,805 B2 | 8/2003 | Chang |
| 6,607,957 B1 | 8/2003 | Fan |
| 6,610,586 B1 | 8/2003 | Liu |
| 6,613,632 B2 | 9/2003 | Liu |
| 6,617,204 B2 | 9/2003 | Sung |
| 6,673,664 B2 | 1/2004 | Hsu |
| 6,677,204 B2 | 1/2004 | Cleeves et al. |
| 6,706,598 B2 | 3/2004 | Lai |
| 6,706,599 B1 | 3/2004 | Sadd |
| 6,806,532 B2 * | 10/2004 | Kobayashi ............ 257/324 |
| 2001/0001075 A1 | 5/2001 | Ngo |
| 2001/0004332 A1 | 6/2001 | Eitan |
| 2001/0011755 A1 | 8/2001 | Tasaka |
| 2002/0068403 A1 | 6/2002 | Huang |
| 2002/0142569 A1 | 10/2002 | Chang |
| 2002/0146885 A1 | 10/2002 | Chen |
| 2002/0151138 A1 | 10/2002 | Liu |
| 2002/0177275 A1 | 11/2002 | Liu |
| 2002/0182829 A1 | 12/2002 | Chen |
| 2003/0013253 A1 | 1/2003 | Hurley |
| 2003/0032243 A1 | 2/2003 | Ogura |
| 2003/0057997 A1 | 3/2003 | Sun |
| 2003/0067807 A1 | 4/2003 | Lin |
| 2003/0117861 A1 | 6/2003 | Maayan |
| 2003/0235075 A1 | 12/2003 | Forbes |
| 2004/0002182 A1 | 1/2004 | Lai |
| 2004/0004245 A1 | 1/2004 | Forbes et al. |
| 2004/0014278 A1 | 1/2004 | Lee |

FOREIGN PATENT DOCUMENTS

| | | |
|---|---|---|
| EP | 90115805.5 | 2/1991 |
| EP | 01113179.4 | 12/2002 |
| WO | WO 03/017374 A2 | 2/2003 |

OTHER PUBLICATIONS

B. Eitan et al., "Spatial Characterization of Hot Carriers Injected into the Gate Dielectric Stack of a MOFSET Based on Non-Volatile Memory Device," date unknown, pp. 58-60.

B. Eitan et al., "NROM: A Novel Localized Trapping, 2-Bit Nonvolatile Memory Cell," IEEE Electron Device Lett, vol. 21, No. 11, (Nov. 2000), pp. 543-545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1-8, Copyright Saifun Semiconductors Ltd. 2002.

E. Maayan et al., "A 512Mb NROM Flash Data Storage Memory with 8MB/s Data Range," ISSCC 2002 Visuals Supplement, Session 6, SRAM and Non-Volatile Memories, 6.1 and 6.2, pp. 76-77, 407-408. Copyright 1990 IEEE.

M. Janai, "Data Retention, Endurance and Acceleration Factors of NROM Devices," IEEE 41$^{st}$ Annual International Reliability Physics Symposium, Dallas, TX (2003), pp. 502-505, Copyright 1989 IEEE.

S. Minami and Y. Kamigaki, "A Novel MONOS Nonvolatile Memory Device Ensuring 10-Year Data Retention after $10^7$ Erase/Write Cycles," IEEE Transactions of Electron Devices, vol. 40, No. 11 (Nov. 1993) pp. 2011-2017, Copyright 1998 IEEE.

C. Pan, K. Wu, P. Freiberger, A. Chatterjee, G. Sery, "A Scaling Methodology for Oxide-Nitride-Oxide Interpoly Dielectric for EPROM Applications," IEEE Transactions on Electron Devices, vol. 37, No. 6, (Jun. 1990), pp. 1439-1443, Copyright 1990 IEEE.

P. Manos and C. Hart, "A Self-Aligned EPROM Structure with Superior Data Retention," IEEE Electron Device Letters, vol. 11, No. 7, (Jul. 1990) pp. 309-311, Copyright 1990 IEEE.

W. Owen and W. Tchon, "E$^2$PROM Product Issues and Technology Trends," IEEE 1989, pp. 17-19, Copryright 1989 IEEE.

T. Huang, F. Jong, T. Chao, H. Lin, L. Leu, K. Young, C. Lin, K. Chiu, "Improving Radiation Hardness of EEPROM/Flash Cell BY N$_2$0 Annealing," IEEE Electron Device Letters, vol. 19, No. 7 (Jul. 1998), pp. 256-258, Copyright 1998 IEEE.

B. Eitan et al., "Electrons Retention Model for Localized Charge in Oxide -Nitride-Oxide (ONO) Dielectric," IEEE Device Lett., vol. 23, No. 9, (Sep. 2002), pp. 556-558. Copyright 2002 IEEE.

T. Nozaki, T. Tanaka, Y. Kijiya, E. Kinoshita, T. Tsuchiya, Y. Hayashi, "A 1-Mb EEPROM with MONOS Memory Cell for Semiconductor Disk Application," IEEE Journal of Solid-State Circuits, vol. 26, No. 4 (Apr. 1991), pp. 497-501, Copyright 1991 IEEE.

F. Vollebregt, R. Cuppens, F. Druyts, G. Lemmen, F. Verberne, J. Solo, "A New E(E)PROM Technology With A TiSi$_2$ Control Gate," IEEE 1989, pp. 25.8.1-25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939-1946, Copyright 2002 IEEE.

B. Eitan et al., "Spatial characterization of Channel hot electron injection utilizing subthreshold slope of the localized charge storage NROM™ memory device," Non-Volatile Semiconductor Memory Workshop (NVSMW), Monterey, CA, (Aug. 2001), pp. 1-2.

B. Eitan et al., "Can NROM, a 2-bit, Trapping Storage NVM Cell, Give a Real Challenge to Floating Gate Cells?" Int. Conf. on Solid State Devices and Materials, Tokyo, (1999), pp. 1-3, Copyright 1999 Saifun Semiconductors Ltd.

S. Ogura, et al. "Twin MONOS Cell with Dual Control Gates," Halo LSI and New Halo, pp. 187-187.3, date unknown.

T. Sugizaki, et al. "New 2-bit/Tr MONOS Type Flash Memory using Al$_2$O$_3$ as Charge Trapping Layer," Fujitsu Laboratories Ltd,. 1999.

T. Saito, et al. "Hot Hole Erase Characteristics and Reliability in Twin MONOS Device" Halo LSI,.2001.

Saifun Semiconductors, LTD. PowerPoint Presentation, 2000.

Y. Roizin, et al. "Novel Techniques for data retention and Leff measurements in two bit *Micro*Flash® Memory Cells," Characterization and Metrology for ULSI Technology: 200 International Conf., pp. 181-185, Copyright 2001 American Institute of Physics, 1-56396-967-X/01.

W. J. Tsai, et al. "Cause of Data Retention Loss in a Nitride-Based Localized Trapping Storage Flash Memory Cell," IEEE 40th Annual International Reliability Physics Symposium, Dallas, (2002), pp. 34-38. Copyright 2002 IEEE.

W.J. Tsai, et al. "Data Retention Behavior of a SONOS Type Two-Bit Storage Flash Memory Cell," IEDM 01-0179-01-722, Copyright 2001 IEEE.

A. Shappir, et al., "Subtresholod slope degradation model for localized-charge-trapping based non-volatile memory devices," Solid-State Electronics 47 (2003), pp. 937-941. Copyright 2003 Elsevier Science Ltd.

R. Neale, "AMD's MirrorBit—a big step in Flash progress," Electronic Engineering Design, V. 74, No. 906, pp. 47-50. 2001.

I. Bloom, et al., "NROM™—a new technology for non-volatile memory products" Solid-State Electronics 46 (2002), pp. 1757-1763. Copyright 2002 Elsevier Science Ltd.

J. Bu and M. White, "Electrical characterization on ONO triple dielectric in SONOS nonvolatile memory devices," Solid-State Electronics 45 (2001) pp. 47-51. Copyright 2001 Elsevier Science Ltd.

Y. Kamigaki and S. Minami, "MNOS Nonvolatile Semiconductor Memory Technology: Present and Future," IEICE Trans. Electron, vol. E84-C, No. 6, pp. 713-723 (Jun. 2001).

E. Lusky, et al., "Electron Discharge Model of Locally-Trapped Charge in Oxide-Nitride-Oxide (ONO) Gates for NROM™ Non-Volatile Semiconductor Memory Devices," Extended Abstracts of the 2001 International Conference on Solid State Devices and Materials, Tokyo, 2001 pp. 534-535.

A. Nughin, "n-Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228-229, 319.

G. Xue, et al., "Low Voltage Low Cost Nitride Embedded Flash Memory Cell" IMEC., Nov. 2000.

L. Breuil, et al., "A new 2 isolated-bits/cell flash memory device with self aligned split gate structure using ONO stacks for charge storage," IMEC, Sep. 2001.

J. Willer, et al., "UMEM: A U-shape Non-Volatile-Memory Cell," Ingentix GmbH &Co. KG., Infineon Technologies and Saifun Semiconductors, Nov. 2001.

S. Kang, et al., "A Study of SONOS Nonvolatile Memory Cell Controlled Structurally by Localizing Charge-Trapping Layer," Samsung Electrons Co., Ltd., Nov. 2001.

Y. Roizin, et al., "In-Process Charging in *micro*Flash® Memory Cells," Tower Semiconductor, Ltd., Nov. 2001.

A. Shappir, et al., "Subthreshold slope degradation model for localized-charge-trapping based non-volatile memory devices," Solid State Electronics, 47 (2003) pp. 937-941, Copyright 2003 Elsevier Science Ltd.

I. Fujiwara, et al., "High speed program/erase sub 100 nm MONOS memory cell," Sony Corporation, Date Oct. 2000.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1-2., Sep. 2001.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao-Tung University, Nov. 1999.

Y. K. Lee, et al., "30-nm Twin Silicon-Oxide-Nitride-Oxide-Silicon (SONOS) Memory (TSM) with High Erase Speed and Reliability," School of Electrical Engineering, Seoul National University, C&M, System LSI, ATD, PD, Samsung Electronics Co., Sep. 1999.

J. H. Kim, et al., "Highly Manufacturable SONOS Non-Volatile Memory for the Embedded SoC Solution," 2003 Symposium on VLSI Technology Digest of Technical Papers, pp. 31-32.

Y. Hayashi, et al., "Twin MONOS Cell with Dual Control Gates," 2000 Symposium on VLSI Technology Digest of Technical Papers, 2000 IEEE, pp. 122-123.

M. K. Cho and D. M. Kim, "High Performance SONOS Memory Cells Free of Drain Turn-On and Over-Erase: Compatibility Issue with Current Flash Technology," IEEE Electron Device Letters, vol. 21, No. 8, Aug. 2000, pp. 399-401, Copyright 2000 IEEE.

T. Y. Chan, K.K. Young and C. Hu, "A True Single-Transistor Oxide-Nitride-Oxide EEPROM Device," IEEE Electron Device Letters, vol. EDL-8, No. 3, Mar. 1987, pp. 93-95., Copyright 1987 IEEE.

I. Bloom, et al., "NROM™ NVM technology for Multi-Media Applications," Saifun Semiconductors, Ltd. Ingentix, Ltd. and Infineon Technologies, date unknown.

E. J. Prinz, et al., "An Embedded 90nm SONOS Flash EEPROM Utilizing Hot Electron Injection Programming and 2-Sided Hot Hole Injection Erase," Motorola Embedded Memory Center, Sep. 2000.

Y. Roizin, et al., "Retention Characteristics of *micro*Flash® Memory (Activation Energy of Traps in the ONO Stack)," Tower Semiconductor, Ltd., Oct. 1999.

Y. Roizin, et al., "Activation Energy of Traps in the ONO Stack of *micro*Flash® Memory Cells," Tower Semiconductor, Ltd., Oct. 2001.

Y. Roizin, et al., "'Dummy' Gox for Optimization of *micro*Flash® Technology," Tower Semiconductor, Ltd., Oct. 2001.

Y. K. Lee, et al., "Multi-Level Vertical Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI., Oct. 2001.

J. Bu, et al., "Retention Reliability Enhanced SONOS NVSM with Scaled Programming Voltage," Microelectronics Lab., Mar. 1999.

H. Tomiye, et al., "A novel 2-bit/cell MONOS memory device with a wrapped-control-gate structure that applies source-side hot-electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147-148.

* cited by examiner

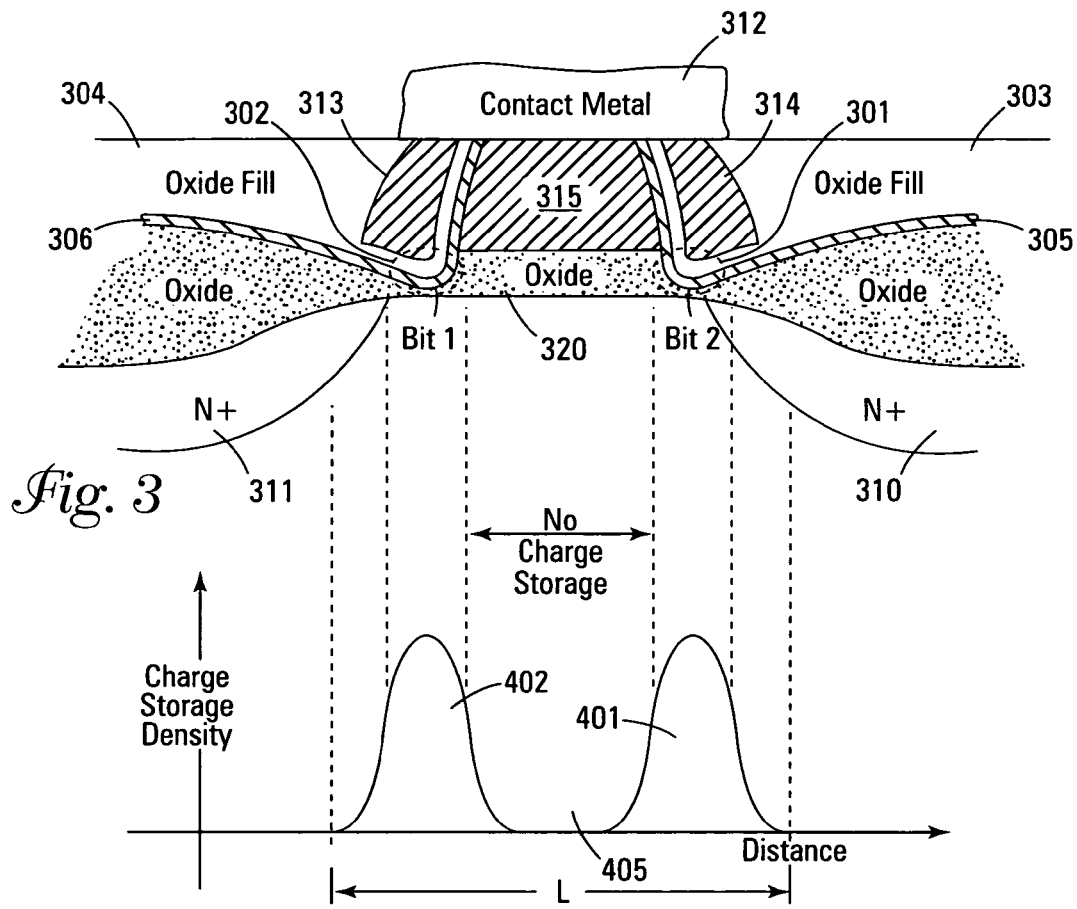
Fig. 3
Fig. 4
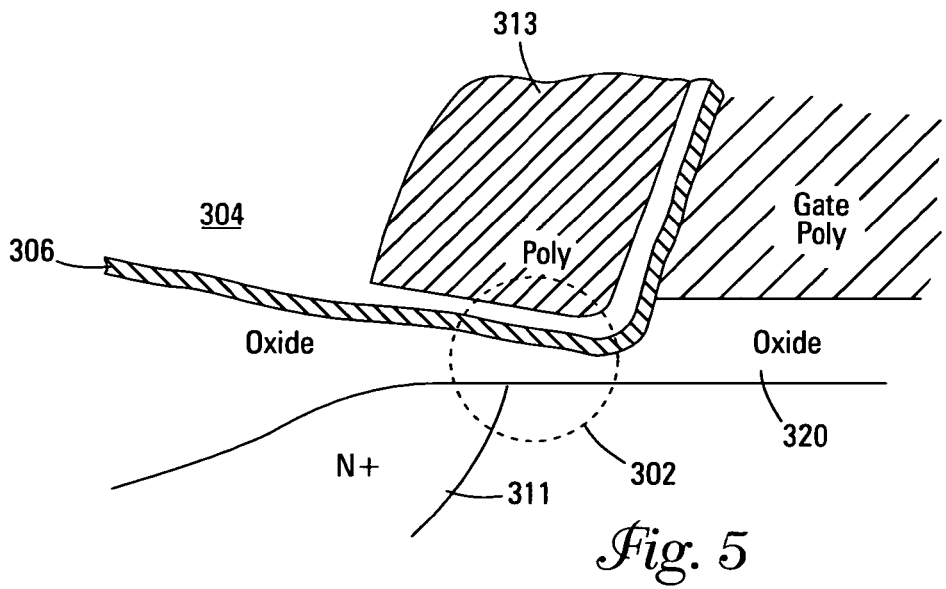
Fig. 5

US 7,480,186 B2

NROM FLASH MEMORY WITH SELF-ALIGNED STRUCTURAL CHARGE SEPARATION

RELATED APPLICATION

This Application is a Continuation of U.S. application Ser. No. 10/701,139, titled "NROM FLASH MEMORY WITH SELF-ALIGNED STRUCTURAL CHARGE SEPARATION," filed Nov. 4, 2003, now U.S. Pat. No. 7,184,315 issued on Feb. 27, 2007, which is commonly assigned and incorporated herein by reference.

TECHNICAL FIELD OF THE INVENTION

The present invention relates generally to memory devices and in particular the present invention relates to nitride read only memory flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

One type of flash memory is a nitride read only memory (NROM). NROM has some of the characteristics of flash memory but does not require the special fabrication processes of flash memory. NROM integrated circuits can be implemented using a standard CMOS process.

FIG. 1 illustrates a cross-sectional view of a typical prior art NROM memory cell with a channel length, L, that is greater than 100 nm. This cell is comprised of a control gate 100 formed on top of an oxide-nitride-oxide (ONO) layer. This layer is comprised of an oxide layer 101 on top of a nitride 103 layer upon which the charge is stored for the various states of the cell. In one embodiment, the cell has trapping areas 105 and 106 for storing two bits of data on the nitride layer 103. The nitride layer 103 is deposited on another oxide layer 104 that is on the substrate.

Two source/drain regions 109 and 111 are at either end of the gate 100. The source/drain regions 109 and 111 are connected by a channel area 110 between the two source/drain regions 109 and 111. The function of each source/drain region 109 or 111 (i.e., whether source or drain) depends upon which bit area 105 or 106 is being read or written. For example, in a read operation, if the carrier is input at the left side source/drain region 111 and output from the right side region 109, the left side is the source 111 and the right side is the drain 109 and the data bit charge is stored on the nitride 103 at the source end 111 for bit area 106.

As IC manufacturers try to increase memory density of NROM devices, the channel length is reduced. FIG. 2 illustrates a typical prior art planar NROM device that has a channel length that is less than 100 nm. In this case, the channel length is so short that the bit trapping areas 205 and 206 overlap. The overlap may cause data write and read errors.

For the reasons stated above, and for other reasons stated below which will become apparent to those skilled in the art upon reading and understanding the present specification, there is a need in the art for a smaller multiple-bit NROM device without trapping area overlap.

BRIEF DESCRIPTION OF THE DRAWINGS

FIG. 3 shows a cross-sectional view of one embodiment of an NROM cell of the present invention.

FIG. 4 shows a resulting charge separation and distribution diagram of the present invention in accordance with the embodiment of FIG. 3.

FIG. 5 shows a cross-sectional view of a detail of the charge storage regions in accordance with the embodiment of FIG. 3.

DETAILED DESCRIPTION

Figure 1:
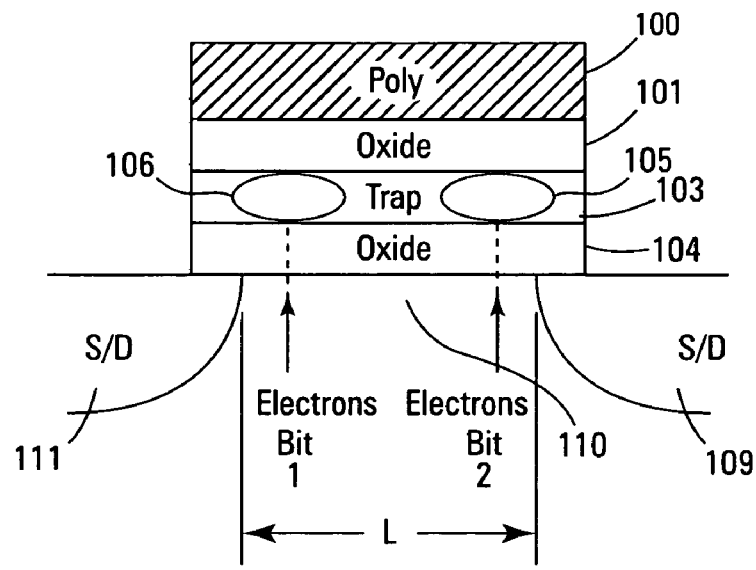
FIG. 1 shows a cross-sectional view of a typical prior art NROM cell with a channel greater than 100 nm.
Figure 2:
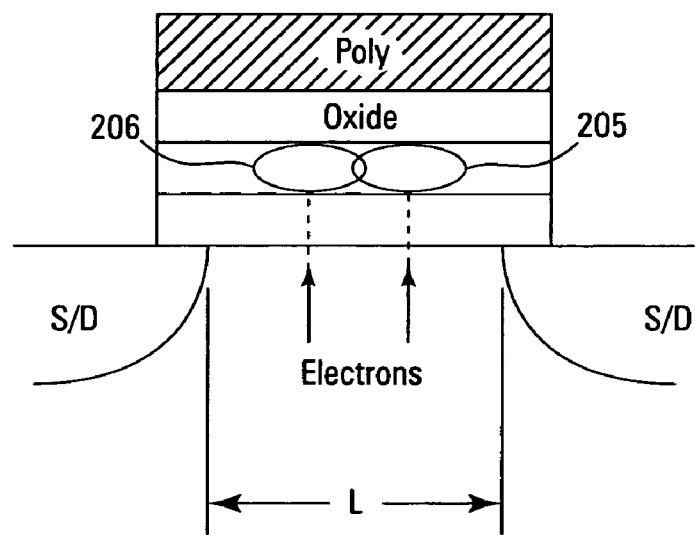
FIG. 2 shows a cross-sectional view of a typical prior art NROM cell with a channel less than 100 nm.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 3 illustrates a cross-sectional view of one embodiment of an NROM cell of the present invention. The cell is comprised of two charge storage areas 301 and 302 that are discussed subsequently in greater detail with reference to FIG. 5. In this embodiment, a nitride layer is not placed under the center of the transistor channel as in the prior art.

The cell has a polysilicon gate structure 313-315 that is comprised of a middle section 315 and two outer sections 313 and 314. A gate insulator is formed on the sides of the middle section of the gate structure 315 such that the insulator separates the middle section 315 from the two gate outer sections 313 and 314. A control gate metal contact 312 is formed over all three sections of the gate structure 313-315.

The middle gate section 315 has only an oxide insulator 320 and does not trap injected electrons in the NROM device structure. In one embodiment, the gate insulator is a composite insulator that is comprised of an oxide-nitride-oxide (ONO) configuration where the charge trapping is accomplished in the nitride layer 305 and 306. In one embodiment, the top oxide layer 301 and 302 is part of the oxide fill 303 and 304 respectively.

Alternate embodiments use other gate insulators besides the ONO structure shown. These structures include oxide-nitride-aluminum oxide composite layers, oxide-aluminum oxide-oxide composite layers, oxide, silicon oxycarbide-oxide composite layers as well as other composite layers.

In still other alternate embodiments, the gate insulator could include thicker than normal silicon oxides formed by wet oxidation and not annealed, silicon rich oxides with inclusions of nanoparticles of silicon, silicon oxynitride layer that are not composite layers, silicon rich aluminum oxide insulators that are not composite layers, silicon oxycarbide insulators that are not composite layers, silicon oxide insulators with inclusions of nanoparticles of silicon carbide, in addition to other non-stoichiometric single layers of gate insulators of two or more commonly used insulator materials such as Si, N, Al, Ti, Ta, Hf, Zr, and La.

The embodiment of FIG. 3 is also comprised of two source/drain regions 310 and 311. In the illustrated embodiment, these regions are n+ type semiconductor material while the substrate is a p+ type semiconductor material. In an alternate embodiment, the source/drain regions may use p+ type semiconductor material while the substrate is n+.

The function of each source/drain region 310 or 311 depends on which bit area 301 or 302 is being read or written. For example, in a read operation, if the carrier is input at the left side source/drain region 311 and output from the right side region 310, the left side is the source 311 and the right side is the drain 310 and the data bit charge is stored on the nitride layer 306 at the source end 311 in bit area 302.

FIG. 4 illustrates one embodiment of a charge separation and distribution diagram in relation to the FIG. 3 embodiment of the NROM cell of the present invention. This diagram indicates the charge storage density in the vertical direction and the distance along the cell in the horizontal direction. The length of the channel between the source/drain areas of FIG. 3 is illustrated as L.

The two charges 401 and 402 stored in the NROM cell are indicated on the charge separation and distribution diagram as coinciding with the charge storage areas 301 and 302 of FIG. 3. The diagram also illustrates that there is no charge present 405 in the middle of the cell.

FIG. 5 illustrates a more detailed cross-sectional view of the charge storage area 302 of the embodiment of FIG. 3. This view clearly shows the oxide 304-nitride 306-oxide 320 composite insulator as shown on the left side of the NROM cell of FIG. 3. The charge storage area 302 as well as one source/drain region 311 and part of the polysilicon gate structure 313 are also shown.

The above-described embodiments show one section of each side of the gate insulator layer substantially horizontal and a second section of each side substantially vertical and extending upwards through the gate structure. The present invention, however, is not limited to any one angle between the substantially horizontal section and the substantially vertical section. In other words, the "horizontal" and "vertical" sections may not be horizontal and vertical. There is also no limitation that each side of the gate insulator layer be symmetrical with the other side.

Figure 6:
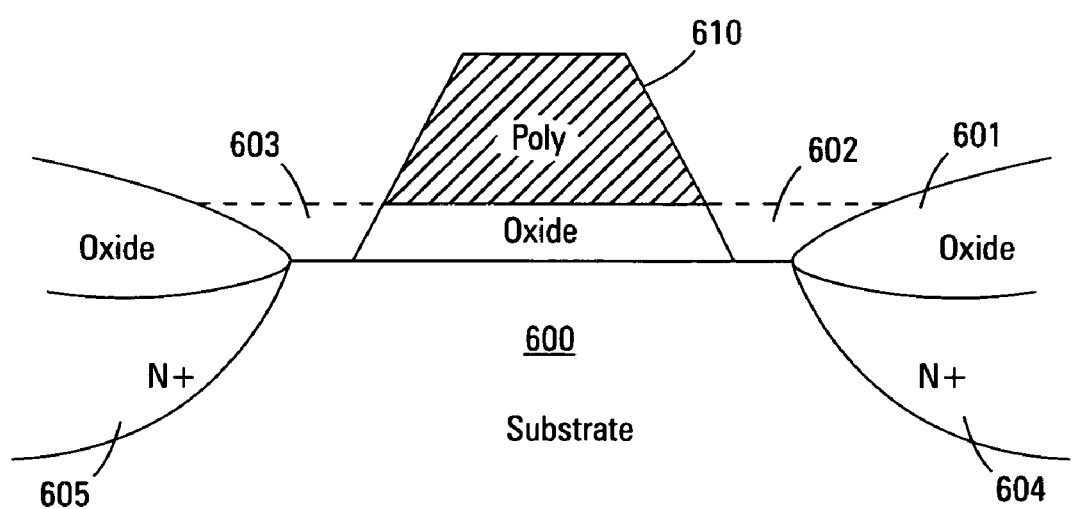
FIG. 6 shows a cross-sectional view of one embodiment of a step in fabrication of the NROM cell of the present invention.

FIG. 6 illustrates a cross-sectional view of one embodiment for a step in fabrication of the NROM cell of FIG. 3. A thicker gate oxide 601 is grown on the substrate 600. The source/drain regions 604 and 605 are implanted. The polysilicon gate electrode 610 is also defined using conventional techniques that are well known in the art.

The gate oxide 601 is then removed in areas 602 and 603 outside the polysilicon gate area by an etch process to define the polysilicon gate structure 610. The oxide can then be regrown to a new desired thickness.

Figure 7:
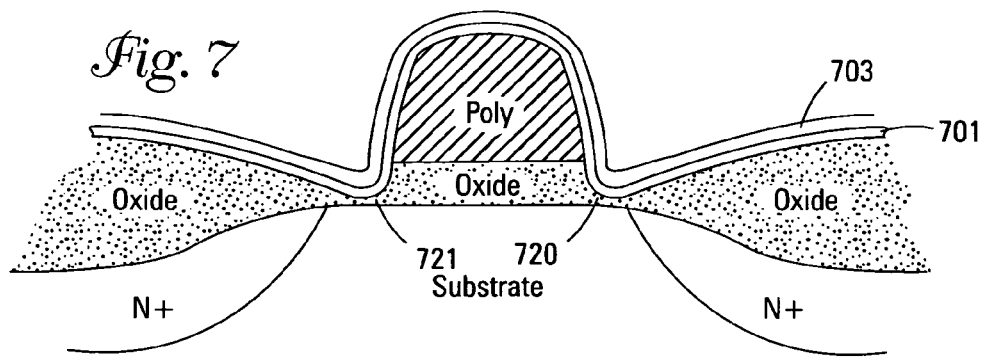
FIG. 7 shows a cross-sectional view of one embodiment of a subsequent step of NROM cell fabrication of the present invention.

FIG. 7 illustrates the regrown oxide areas 720 and 721 outside the polysilicon gate electrode. This structure is then covered with the composite insulators 701 and 703 such as nitride or other insulator as described previously.

Figure 8:
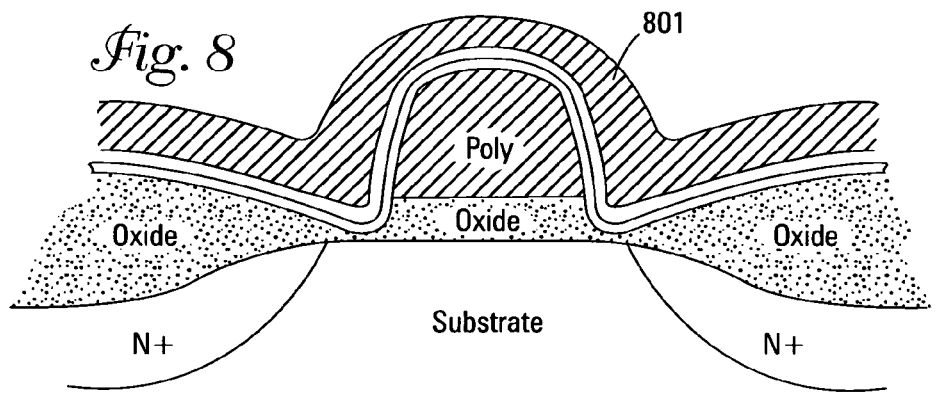
FIG. 8 shows a cross-sectional view of one embodiment of a subsequent step of NROM cell fabrication of the present invention.
Figure 9:
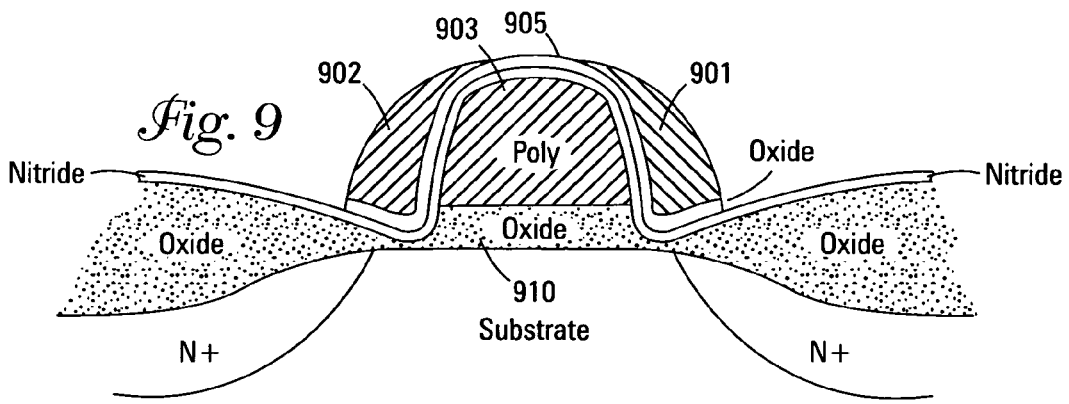
FIG. 9 shows a cross-sectional view of one embodiment of a subsequent step of NROM cell fabrication of the present invention.

FIG. 8 illustrates a cross-sectional view of the NROM cell with a deposited polysilicon layer 801 on top of the composite insulators of FIG. 7. This second polysilicon layer 801 is then directionally etched to leave only the sidewalls 901 and 902 as illustrated in FIG. 9. This provides a structure with a composite gate insulator 905 under the polysilicon gate and along the sidewalls 901 and 902. A single gate oxide 910 is under the central polysilicon gate region 903.

Figure 10:
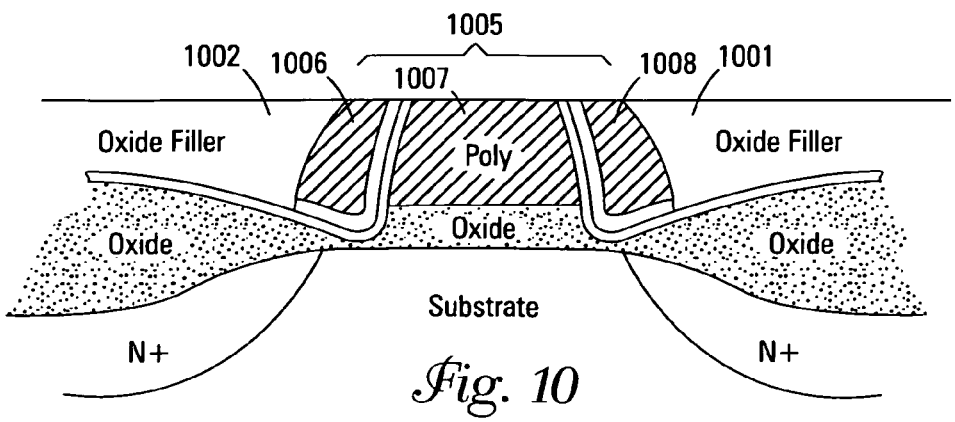
FIG. 10 shows a cross-sectional view of one embodiment of a subsequent step of NROM cell fabrication of the present invention.

FIG. 10 illustrates the NROM cell with a deposited oxide filler 1001 and 1002. The top of the structure is planarized by chemical mechanical polishing (CMP). This removes the insulators from the top 1005 of the central polysilicon gate. A patterned metal contact that selectively adheres to the polysilicon is deposited on top of the gate structures 1006-1008. The electrical gate provides contact to all three gate regions 1006-1008.

In one embodiment, the NROM flash memory cell of the present invention operates by conventional tunnel injection with positive gate voltages with respect to the substrate/p-well. In another embodiment, channel hot electron injection (HEI) can be used for programming. Such an embodiment uses conventional positive gate voltages with respect to the substrate/p-well. Tunneling can be used for erase operations.

Using HEI, the NROM device of the present invention provides two bit storage as in prior art NROM devices. Charges are stored near the drain and the device is read in the reverse direction. Either end of the channel can be used as a drain and a charge stored at both ends of the channel near the surface of the n+ regions.

Figure 11:
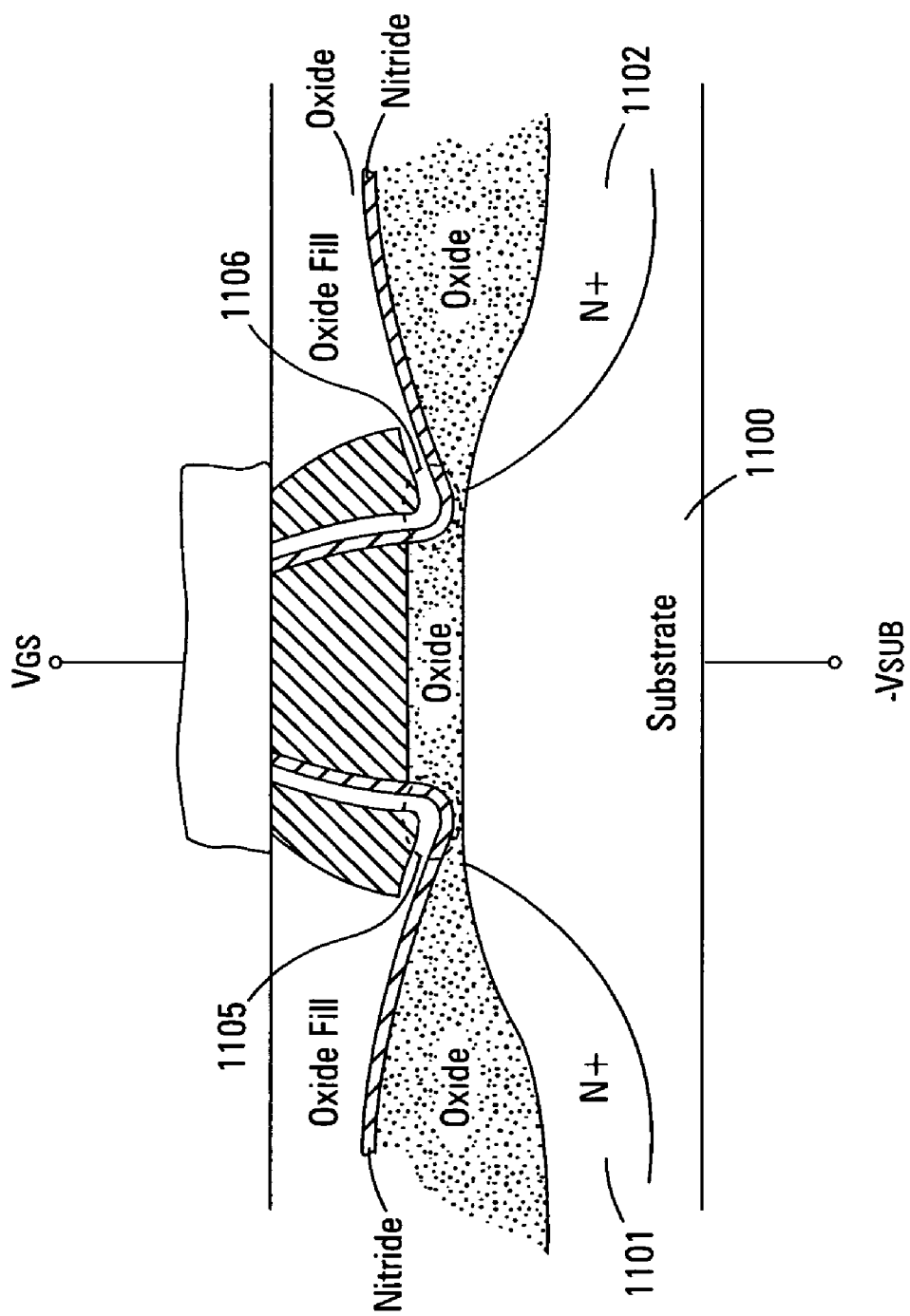
FIG. 11 shows a cross-sectional view of one embodiment for programming the NROM cell of the present invention using substrate enhanced hot electron injection.

FIG. 11 illustrates an embodiment for programming the NROM flash memory cell. In this embodiment, a negative substrate bias, $V_{SUB}$, is applied to the p-type substrate 1100. This bias increases the surface lateral field near a source/drain region 1101 or 1102 (depending on which direction the cell is operated), thus increasing the number of hot electrons. Such a substrate enhanced hot electron (SEHE) injection embodiment would require a lower drain voltage during programming operations. In one embodiment, the negative substrate bias is in the range of 0V to −3V. Alternate embodiments may use other voltage ranges.

As is well known in the art, applying a drain voltage to a first source/drain region 1101 and grounding the second source/drain region 1102 creates a hot electron injection into the gate insulator of the charge storage region 1105 nearest the drain region 1101. The second charge storage region 1106 is programmed by performing the same biasing of the source/drain regions 1101 and 1102 in the reverse direction.

For an erase operation, substrate enhanced band-to-band tunneling induced hot hole injection (SEBBHH) can be used. SEBBHH and SEHE are both well known in the art and are not discussed further.

Figure 12:
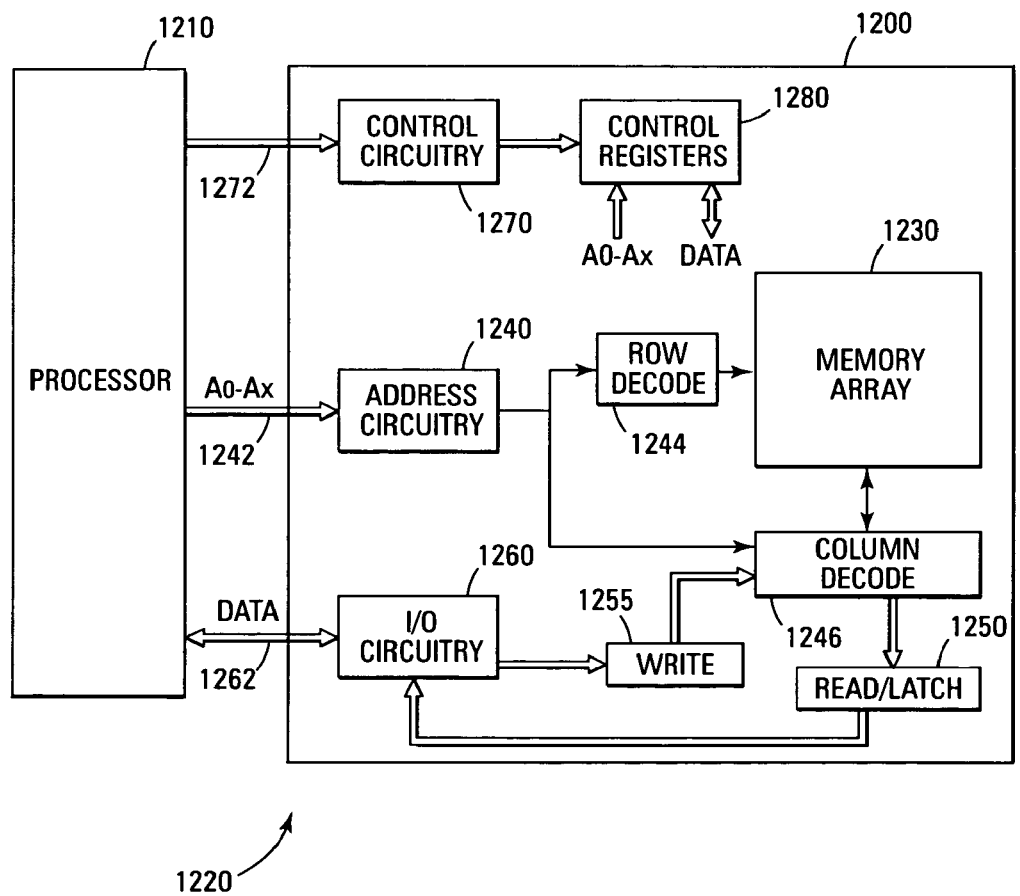
FIG. 12 shows a block diagram of an electronic system of the present invention.

FIG. 12 illustrates a functional block diagram of a memory device 1200 that can incorporate the NAND flash memory cells of the present invention. The memory device 1200 is coupled to a processor 1210. The processor 1210 may be a microprocessor or some other type of controlling circuitry. The memory device 1200 and the processor 1210 form part of an electronic system 1220. The memory device 1200 has been simplified to focus on features of the memory that are helpful in understanding the present invention.

The memory device includes an array of NROM flash memory cells 1230. In one embodiment, the memory cells are NROM flash memory cells and the memory array 1230 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 1240 is provided to latch address signals provided on address input connections A0-Ax 1242. Address signals are received and decoded by a row decoder 1244 and a column decoder 1246 to access the memory array 1230. It will be appreciated by those skilled in the art, with the benefit of the present description, that the number of address input connections depends on the density and architecture of the memory array 1230. That is, the number of addresses increases with both increased memory cell counts and increased bank and block counts.

The memory device 1200 reads data in the memory array 1230 by sensing voltage or current changes in the memory array columns using sense/buffer circuitry 1250. The sense/buffer circuitry, in one embodiment, is coupled to read and latch a row of data from the memory array 1230. Data input and output buffer circuitry 1260 is included for bi-directional data communication over a plurality of data connections 1262 with the controller 1210). Write circuitry 1255 is provided to write data to the memory array.

Control circuitry 1270 decodes signals provided on control connections 1272 from the processor 1210. These signals are used to control the operations on the memory array 1230, including data read, data write, and erase operations. The control circuitry 1270 may be a state machine, a sequencer, or some other type of controller.

Since the NROM memory cells of the present invention use a CMOS compatible process, the memory device 1200 of FIG. 12 may be an embedded device with a CMOS processor.

The flash memory device illustrated in FIG. 12 has been simplified to facilitate a basic understanding of the features of the memory. A more detailed understanding of internal circuitry and functions of flash memories are known to those skilled in the art.

CONCLUSION

In summary, the NROM flash memory transistor of the present invention provides a self-aligned, structural charge separation that allows smaller cells to be manufactured without bit area overlap. This cell provides a low initial threshold voltage, fast operation, and low power consumption in addition to the high memory density. The NROM cell can be used in NOR-type memory arrays, NAND-type memory arrays, or other memory array architectures.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory device comprising:
control circuitry for controlling operation of the memory device; and
a memory array coupled to the control circuitry and comprising a plurality of non-volatile, NROM cells formed on a substrate, each cell comprising:
first and second source/drain regions formed in the substrate;
an oxide layer on the substrate;
a gate insulator layer coupled to a portion of the oxide layer, the gate insulator layer comprising a first section and a separate second section that is not connected to the first section; and
a gate structure comprising a plurality of sections, a middle section coupled to the oxide layer and first and second outer sections each coupled to the gate insulator layer such that the gate insulator layer separates the middle section from any contact with the first and second outer sections.

2. The memory device of claim 1 wherein the gate insulator layer is comprised of a composite oxide-nitride-oxide layer.

3. The memory device of claim 1 wherein the gate insulator layer is a composite layer comprised of one of an oxide-nitride-aluminum oxide composite layer, an oxide-aluminum oxide-oxide composite layer, or an oxide-silicon oxycarbide-oxide composite layer.

4. The memory device of claim 1 wherein the gate insulator layer is a non-composite layer comprised of one of silicon oxides formed by wet oxidation and not annealed, silicon-rich oxides with inclusions of nanoparticles of silicon, silicon oxynitride layers, silicon-rich aluminum oxide insulators, silicon oxycarbide insulators, or silicon oxide insulators with inclusions of nanoparticles of silicon carbide.

5. The memory device of claim 1 wherein the gate insulator is comprised of non-stoichiometric single layers of two or more of silicon, nitrogen, aluminum, titanium, tantalum, hafnium, lanthanum, or zirconium.

6. The memory device of claim 1 wherein a first charge is storable on the first section of the gate insulator layer and a second charge is storable on the second section of the gate insulator layer.

7. The memory device of claim 1 and further comprising an oxide fill layer coupled to at least a portion of the first and second gate insulator sections and the first and second outer sections of the gate structure.

8. The memory device of claim 1 and further including a metal contact coupled to the plurality of sections of the gate structure.

9. The memory device of claim 1 wherein the substrate is a p+type semiconductor and the first and second source/drain regions are n+type semiconductors.

10. A non-volatile memory device comprising:
control circuitry for controlling operation of the memory device; and a memory array coupled to the control circuitry and comprising a plurality of non-volatile, NROM cells formed on a substrate, each cell comprising:

first and second source/drain regions formed laterally in the substrate such that a channel area is formed between them;

an oxide layer on the substrate above the first and second source/drain regions and the channel area;

a gate insulator layer comprising a first section and a separate second section that does not connect to the first section, a substantially horizontal portion of the first and second sections coupled to separate areas of the oxide layer; and a gate structure comprising a middle section and first and second outer sections, the middle section coupled to the oxide layer and separating the first and second gate insulator sections, the first and second outer sections each separated from any contact with the middle section by the first and second sections, respectively, of the gate insulator.

11. The memory device of claim 10 wherein the substrate is coupled to a negative bias that enhances hot electron injection.

12. The memory device of claim 10 wherein the gate structure is comprised of a polysilicon material.

13. The memory device of claim 10 and further including an oxide material coupled to the first and second outer sections of the gate structure and portions of the gate insulator layer not within the gate structure.

14. A non-volatile memory device comprising:
control circuitry for controlling operation of the memory device; and
a memory array coupled to the control circuitry and comprising a plurality of non-volatile, NROM cells formed on a substrate, each cell comprising:

first and second source/drain regions formed laterally in the substrate such that a channel area is formed between them;

an oxide layer on the substrate above the first and second source/drain regions and the channel area;

a composite gate insulator layer comprising a first section and a separate second section that is not in contact with the first section, a substantially horizontal portion of each section coupled to separate areas of the oxide layer and a substantially vertical portion of each section extending from the oxide layer, the composite gate insulator layer having a nitride layer for storing a charge on each of the first and second sections;

a polysilicon gate structure comprising a middle section and first and second outer sections, the middle section coupled to the oxide layer and separated from any contact with the first and second outer sections by the substantially vertical portions of the gate insulator layer; and a gate metal contact coupled to the outer and middle sections of the gate structure and each of the substantially vertical portions of the gate insulator.

15. The memory device of claim 14 and further including an oxide material deposited on the composite gate insulator and the outer sections of the gate structure.

16. The memory device of claim 14 wherein the transistor is operated with either the first source/drain region or the second source/drain region serving as the source region in response to a direction of operation of the transistor.

17. A method for fabricating an NROM memory device, the method comprising:

forming first and second source/drain regions in a substrate for each memory cell of a plurality of memory cells, the first and second source/drain regions positioned laterally on the substrate and separated by a channel area;

depositing an oxide layer over the substrate including the first and second source/drain regions and the channel area;

forming a polysilicon middle gate region on the oxide layer above the channel area for each memory cell;

depositing a gate insulator layer over the oxide layer;

depositing a polysilicon layer over the gate insulator layer;

etching the polysilicon layer for each memory cell such that two outer gate regions are left from the polysilicon layer thus forming a gate structure with a middle gate region and two outer gate regions separated from the middle by the gate insulator layer;

planarizing a top of the gate structure of each memory cell such that the gate insulator layer is removed from the top of the gate structure; and forming a contact over the gate structure of each memory cell that is coupled to each region of the gate structure and remaining end portions of the gate insulator layer.

18. The method of claim 17 and further including etching the oxide layer of each memory cell, prior to depositing the gate insulator, such that the channel area silicon on either side of the middle gate region is substantially exposed.

19. The method of claim 17 wherein planarizing comprises using chemical mechanical polishing.

20. The method of claim 17 wherein the plurality of memory cells are arranged in an array of bit line columns and word line rows.

21. A method for fabricating an NROM memory device, the method comprising:

forming first and second source/drain regions in a substrate for each memory cell of a plurality of memory cells, the first and second source/drain regions positioned laterally on the substrate and separated by a channel region;

forming a composite insulator over the substrate including the first and second source/drain regions and the channel region, the composite insulator having a lower oxide layer;

forming a polysilicon middle gate region on the lower oxide layer above the channel region for each memory cell;

forming a gate structure with the middle gate region wherein two outer gate regions are separated from any contact with the middle gate region by at least two layers of the composite insulator; and forming a contact on the gate structure of each memory cell, the contact coupled to each region of the gate structure and end portions of the at least two layers of the composite insulator.

22. The method of claim 21 wherein the composite insulator is comprised of an oxide-nitride-oxide structure that includes the lower oxide layer.

23. The method of claim 21 wherein the lower oxide layer over the source/drain regions is thicker than a remaining portion of the lower oxide layer.

24. The method of claim 22 wherein an upper oxide layer is an oxide fill that is also part of the at least two layers of the composite insulator between the middle gate region and the two outer gate regions.

25. The method of claim 21 wherein the at least two layers of the composite insulator are substantially perpendicular to the substrate.

* * * * *